United States Patent
Won et al.

(10) Patent No.: US 11,713,418 B2
(45) Date of Patent: Aug. 1, 2023

(54) CORE SHELL QUANTUM DOT AND ELECTRONIC DEVICE INCLUDING THE SAME

(71) Applicant: SAMSUNG ELECTRONICS CO., LTD., Suwon-si (KR)

(72) Inventors: Yuho Won, Seoul (KR); Hwea Yoon Kim, Gwacheon-si (KR); Jeong Hee Lee, Seongnam-si (KR); Eun Joo Jang, Suwon-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/558,774

(22) Filed: Dec. 22, 2021

(65) Prior Publication Data
US 2022/0204844 A1    Jun. 30, 2022

(30) Foreign Application Priority Data
Dec. 28, 2020    (KR) .......................... 10-2020-0185149

(51) Int. Cl.
*C09K 11/88* (2006.01)
*C09K 11/02* (2006.01)
(Continued)

(52) U.S. Cl.
CPC ............ *C09K 11/883* (2013.01); *C01G 9/006* (2013.01); *C09K 11/025* (2013.01); *H01L 33/50* (2013.01); *B82Y 20/00* (2013.01); *B82Y 40/00* (2013.01); *C01P 2004/04* (2013.01); *C01P 2004/64* (2013.01); *C01P 2006/60* (2013.01); *H10K 50/115* (2023.02); *H10K 2102/00* (2023.02)

(58) Field of Classification Search
CPC ..... C09K 11/883; C09K 11/025; H01L 33/50; B82Y 20/00; B82Y 40/00; H10K 50/115
See application file for complete search history.

(56) References Cited

U.S. PATENT DOCUMENTS 8,637,082 B2 *    1/2014    Tulsky ................... B82Y 30/00
                                                            424/489
9,957,442 B2    5/2018    Banin et al.
(Continued)

FOREIGN PATENT DOCUMENTS

JP    6638409 B2    1/2020
KR    1744871 B1    6/2017
(Continued)

OTHER PUBLICATIONS

M. J. Anc et al., "Progress in Non-Cd Quantum Dot Development for Lighting Applications," ECS Journal of Solid State Science and Technology, Nov. 28, 2012, pp. R3071-R3082, vol. 2.
(Continued)

*Primary Examiner* — C Melissa Koslow
(74) *Attorney, Agent, or Firm* — Cantor Colburn LLP

(57) ABSTRACT

A quantum dot including zinc, tellurium, selenium, and sulfur, wherein the quantum dot comprises a core and a shell disposed on the core, and wherein the quantum dot is a cadmium-free red light-emitting quantum dot and has an emission peak wavelength of greater than or equal to about 600 nanometers (nm), and efficiency of greater than or equal to about 50%.

20 Claims, 6 Drawing Sheets

(51) Int. Cl.
*C01G 9/00* (2006.01)
*H01L 33/50* (2010.01)
*B82Y 20/00* (2011.01)
*B82Y 40/00* (2011.01)
*H10K 50/115* (2023.01)
*H10K 102/00* (2023.01)

(56) References Cited

U.S. PATENT DOCUMENTS

| | | |
|---|---|---|
| 10,590,340 B2 | 3/2020 | Jang et al. |
| 10,852,587 B2 | 12/2020 | Nam et al. |
| 10,975,298 B2 | 4/2021 | Jang et al. |
| 2018/0201834 A1 | 7/2018 | Banin et al. |
| 2018/0292714 A1 | 10/2018 | Li et al. |
| 2019/0153317 A1* | 5/2019 | Kim .................. C09K 11/883 |
| 2019/0276737 A1* | 9/2019 | Won .................. H10K 50/17 |
| 2019/0280233 A1* | 9/2019 | Kim .................. H10K 85/151 |
| 2021/0041747 A1 | 2/2021 | Nam et al. |
| 2021/0222061 A1 | 7/2021 | Jang et al. |

FOREIGN PATENT DOCUMENTS

| | | |
|---|---|---|
| KR | 20180025388 A | 3/2018 |
| KR | 1856615 B1 | 5/2018 |
| KR | 1978691 B1 | 5/2019 |
| KR | 20190068242 A | 6/2019 |
| KR | 20190085887 A | 7/2019 |

OTHER PUBLICATIONS

Jiwon Bang et al., "ZnTe/ZnSe (Core/Shell) Type-II Quantum Dots: Their Optical and Photovoltaic Properties," Chem. Mater., Published on Web Nov. 23, 2009, pp. 233-240, vol. 22.

Jun Hyuk Chang et al., "Pushing the Band Gap Envelope of Quasi-Type II Heterostructured Nanocrystals to Blue: ZnSe/ZnSe1-XTeX/ZnSe Spherical Quantum Wells," Energy Material Advances, Feb. 5, 2021, pp. 1-10, vol. 2021.

Simon M. Fairclough et al., "Growth and Characterization of Strained and Alloyed Type-II ZnTe/ZnSe Core—Shell Nanocrystals," J Phys. Chem. C, Nov. 18, 2012, pp. 26898-26907, vol. 116.

* cited by examiner

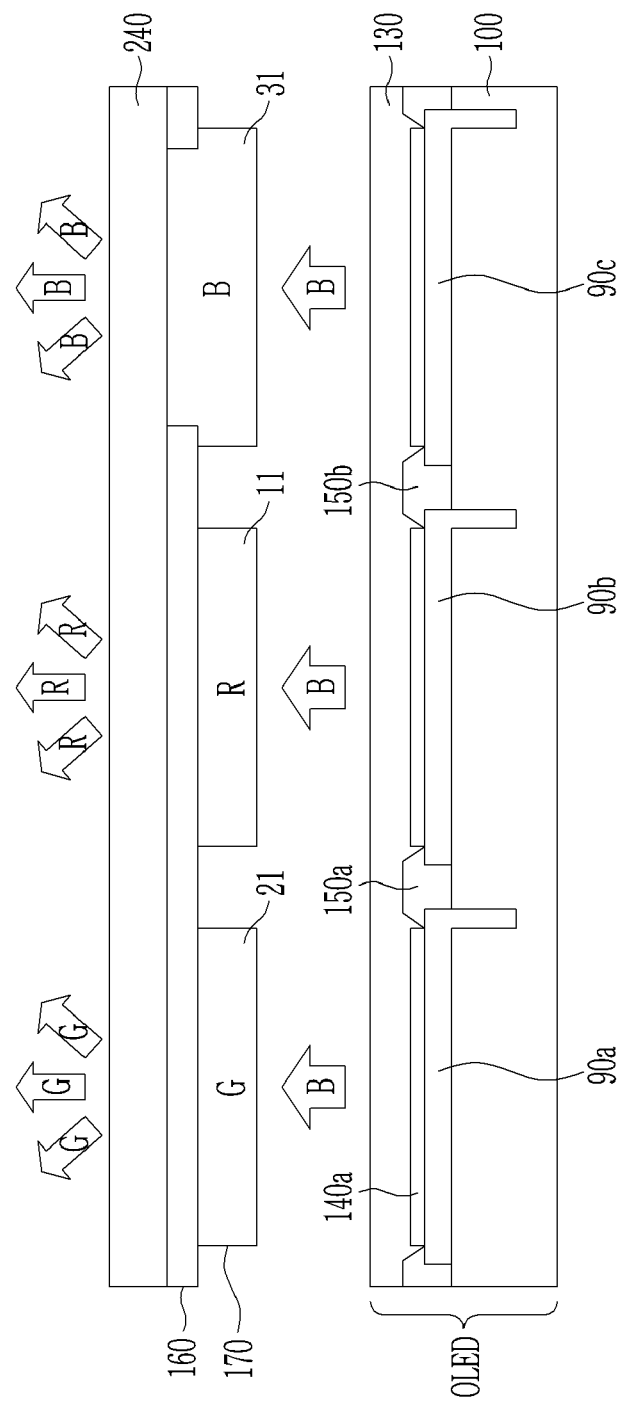

CORE SHELL QUANTUM DOT AND ELECTRONIC DEVICE INCLUDING THE SAME

CROSS-REFERENCE TO RELATED APPLICATION

This application claims priority to and the benefit of Korean Patent Application No. 10-2020-0185149 filed in the Korean Intellectual Property Office on Dec. 28, 2020, the entire contents of which are incorporated herein by reference.

BACKGROUND

1. Field

A core shell quantum dot and an electronic device, e.g., apparatus, including the same are disclosed.

2. Description of the Related Art

Physical properties (e.g., bandgap energies, melting points, etc.) of nanoparticles that are intrinsic properties may be controlled by changing the particle sizes of the nanoparticles, unlike bulk materials. For example, semiconductor nanocrystal particles, also referred to as quantum dots, are a crystalline material having a size of several nanometers. Such semiconductor nanocrystal particles have such a small size that they have a large surface area per unit volume and exhibit quantum confinement effects, and have different properties from the properties of bulk materials having the same composition. Quantum dots may absorb light from an excitation source to be in an excitation state, and may emit energy corresponding to the bandgap energies of the quantum dots.

SUMMARY

An embodiment provides a cadmium-free red light-emitting quantum dot that emit red light with improved efficiency.

An embodiment provides a quantum dot-polymer composite including the cadmium-free red light-emitting quantum dot.

An embodiment provides a display device including the quantum dot-polymer composite.

An embodiment provides an electroluminescent device including the cadmium-free red light-emitting quantum dots in a light emitting layer.

A quantum dot according to an embodiment includes zinc, tellurium, selenium, and sulfur, wherein the quantum dot comprises a core and a shell disposed on the core, and wherein the quantum dot is a cadmium-free red light-emitting quantum dot having an emission peak wavelength of greater than or equal to about 600 nanometers (nm) and efficiency of greater than or equal to about 50%.

The core of the quantum dot may include zinc and tellurium.

The shell of the quantum dot may include zinc and selenium.

The shell of the quantum dot may further include sulfur.

The shell of the quantum dot may have a composition that varies in a radial direction.

The shell of the quantum dot may include a first layer disposed directly on the core and a second layer disposed on the first layer, wherein the first layer and the second layer may include semiconductor nanocrystals having different compositions.

The first layer may include zinc, selenium, and optionally sulfur, and the second layer may include zinc and sulfur.

The second layer may be an outermost layer of the quantum dot, and the second layer does not include selenium.

A mole ratio of zinc to tellurium in the quantum dot may be in a range of about 1:0.01 to about 1:0.1.

A mole ratio of zinc to selenium in the quantum dot may be in a range of about 1:0.2 to about 1:0.7.

A mole ratio of zinc to sulfur in the quantum dot may be in a range of about 1:0.1 to about 1:0.6.

An average particle diameter of the quantum dot may be greater than or equal to about 6 nm.

A thickness of the shell of the quantum dot may be greater than or equal to about 2 nm.

A full width at half maximum (FWHM) of the emission peak wavelength of the quantum dot may be less than or equal to about 60 nm.

A quantum dot-polymer composite according to an embodiment includes a polymer matrix; and quantum dots according to an embodiment dispersed in the polymer matrix.

The polymer matrix may include a thiolene resin, a (meth)acrylate polymer, a urethane resin, an epoxy, a vinyl polymer, a silicone resin, or a combination thereof.

A display device according to an embodiment includes a light source and a light emitting element, wherein the light emitting element includes the quantum dot-polymer composite according to an embodiment, and the light source is configured to provide the light emitting element with incident light.

An electroluminescent device according to an embodiment includes a first electrode and a second electrode facing each other, and a quantum dot light emitting layer between the first electrode and the second electrode and including a plurality of quantum dots, wherein the quantum dots include quantum dots according to an embodiment.

The electroluminescent device may include a charge auxiliary layer between the first electrode and the quantum dot light emitting layer, between the second electrode and the quantum dot light emitting layer, or between the first electrode and the quantum dot light emitting layer and between the second electrode and the quantum dot light emitting layer.

The charge auxiliary layer may include a charge transporting layer, a charge injecting layer, or a combination thereof.

The quantum dot according to an embodiment emits red light, exhibits high luminous efficiency, and has a low full width at half maximum (FWHM) of the emission peak, and may exhibit excellent optical properties. Such quantum dots may be used in a color conversion layer of a display device or a light emitting layer of an electroluminescent device to implement a high color reproduction display. In addition, such quantum dots may be desirably used for, e.g., in, a biological labeling (biosensor, bio-imaging), a photodetector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which:

FIG. 2A is a schematic cross-sectional view of a display device according to an embodiment.

DETAILED DESCRIPTION

Figure 1:
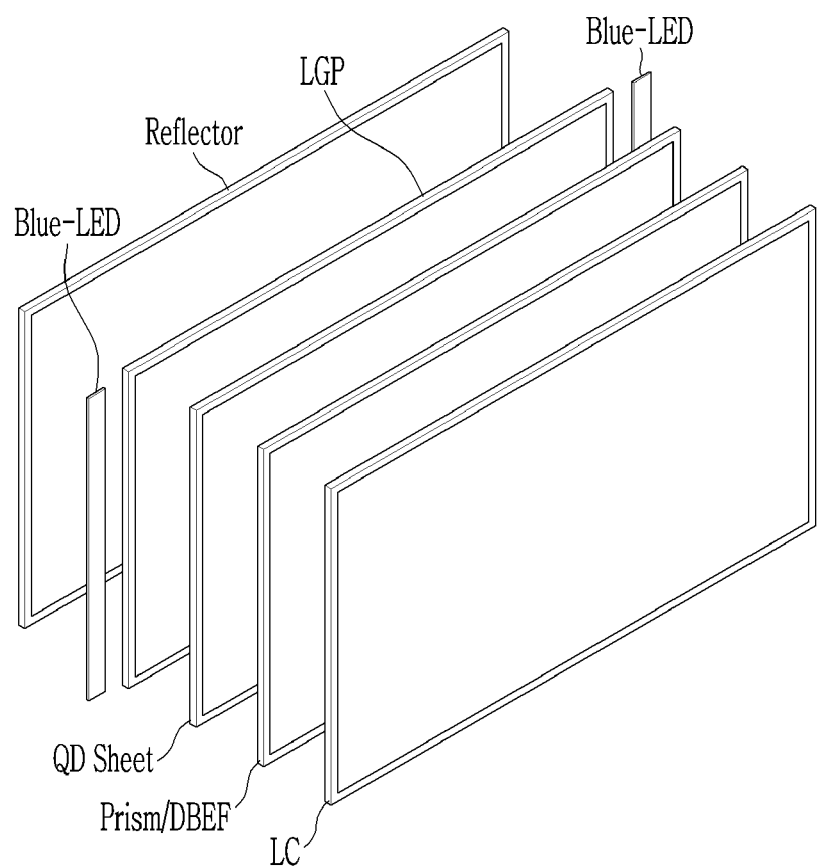
FIG. 1 is an exploded view of a display device according to an embodiment.

Advantages and characteristics of this disclosure, and a method for achieving the same, will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, as used herein, when a definition is not otherwise provided, "substituted" refers to replacement of hydrogen of a compound or a corresponding moiety by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, when a definition is not otherwise provided, "hydrocarbon" and "hydrocarbon group" refers to a compound or a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon or hydrocarbon group, a, e.g., at least one, methylene may be replaced by an oxide moiety, a carbonyl moiety, an ester moiety, —NH—, or a combination thereof. Unless otherwise stated to the contrary, the hydrocarbon compound or hydrocarbon group (alkyl, alkenyl, alkynyl, or aryl) group may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl, hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of a, e.g., at least one, hydrogen from an aromatic group (e.g., a phenyl or naphthyl group).

As used herein, when a definition is not otherwise provided, "hetero" refers to one including 1 to 3 heteroatoms of N, O, S, Si, P, or a combination thereof.

As used herein, when a definition is not otherwise provided, "Group" refers to a group of the periodic table of the elements.

Semiconductor nanocrystal particles (hereinafter, also referred to as quantum dots) may absorb light from an excitation source and may emit energy corresponding to the bandgap energies of the semiconductor nanocrystal particles. Bandgap energies of quantum dots may be changed according to sizes and compositions of nanocrystals. For example, as the sizes of quantum dots increase, the quantum dots may have narrower, e.g., smaller, bandgap energies and increased emission wavelengths. Semiconductor nanocrystals may be used as light emitting materials in various fields such as a display device, an energy device, or a bioluminescent device.

Quantum dots having luminescence properties at an applicable, e.g., desirable, level may be based on cadmium (Cd). Cadmium may cause severe environment/health problems and a restricted element by Restriction of Hazardous Substances Directive (RoHS) in a plurality of countries. Therefore, it is desirable to develop cadmium-free quantum dots which may emit light of a desired wavelength while having improved luminescence properties, for example, when applied to, e.g., used in, an electroluminescent device.

Quantum dots emitting red light without including heavy metals such as cadmium, lead (Pb), or the like, include indium phosphide (InP)-based, i.e., InP-containing, and copper indium sulfide ($CuInS_2$)-based i.e., $CuInS_2$-containing, quantum dots. InP quantum dots have excellent photo characteristics, but In is a rare metal and may desirably be replaced someday. $CuInS_2$ quantum dots include In but have a large full width at half maximum (FWHM) of greater than or equal to about 100 nm and may be difficult to apply to, e.g., use in, a display. Accordingly, it is desirable to develop high efficiency red light-emitting quantum dots with a new composition.

The quantum dot according to an embodiment has a core/shell structure and includes zinc (Zn), tellurium (Te), selenium (Se), and sulfur (S), in which the shell is uniformly formed to have a predetermined thickness or minimum predetermined thickness, and accordingly, includes no cadmium but may emit red light with high efficiency. For example, the aforementioned quantum dot may be a ZnTe-based, i.e., ZnTe-containing, quantum dot that includes zinc and tellurium, for example, zinc telluride (ZnTe) form in a core. Provided is a ZnTe-based quantum dot that emits red light with high luminous efficiency.

As described herein, in order to increase an emission wavelength of quantum dots, a size of the quantum dots should be increased, which may be accomplished by increasing a thickness of a shell disposed on a core, but while the thickness of the shell is increased, the shell is difficult to form in a uniform shape. For example, when the shell is formed to have a thickness of about 5 monolayers (ML) or more, the shell starts to be formed in a non-uniform shape, which may deteriorate luminous efficiency. In other words, it is difficult to manufacture a cadmium-free quantum dot having an increased shell thickness and emitting red light, and simultaneously, having high luminous efficiency.

An embodiment provides a cadmium-free red light-emitting quantum dot that has a core/shell structure, includes zinc, tellurium, selenium, and sulfur, and has an emission peak wavelength of greater than or equal to about 600 nm, an efficiency of greater than or equal to about 50%, for example, greater than or equal to 51%, greater than or equal to about 52%, greater than or equal to about 53%, greater than or equal to about 54%, greater than or equal to about 55%, greater than or equal to about 56%, greater than or equal to about 57%, greater than or equal to about 58%, greater than or equal to about 59%, or greater than or equal to about 60%, and a full width at half maximum (FWHM) of the emission peak wavelength of less than or equal to about 60 nm and exhibits high efficiency and high color purity.

In an embodiment, the core of the quantum dot may include zinc and tellurium, for example, a ZnTe-type semiconductor nanocrystal.

Optionally, the core of the quantum dot may further include sulfur, selenium, or a combination thereof in addition to the zinc and the tellurium. In an embodiment, the core of the quantum dot may include semiconductor nanocrystals including the zinc and the tellurium.

The shell of the quantum dot may include zinc and selenium and in addition, sulfur. For example, the shell may include semiconductor nanocrystals including zinc and selenium, and optionally, sulfur.

In addition, in an embodiment, the shell of the quantum dot includes semiconductor nanocrystals including zinc, selenium, and sulfur, and optionally, tellurium.

The shell may include a first layer disposed directly on the core and a second layer disposed on the first layer, wherein the first layer and the second layer may have different compositions.

For example, the first layer may include zinc, selenium, and optionally sulfur, and the second layer may include zinc and sulfur.

In an embodiment, the second layer may be an outermost layer of the quantum dots, and the second layer may not include selenium. In an embodiment, the second layer may be formed of semiconductor nanocrystals including zinc and sulfur. For example, the second layer may be formed by stacking one or more monolayers (ML) of the semiconductor nanocrystals including zinc and sulfur on the first layer. For example, the second layer may be formed to a thickness of about 1 ML or more, about 2 ML or more, or about 3 ML or more, but is not limited thereto.

In an embodiment, the first layer may include semiconductor nanocrystals including zinc and selenium, or semiconductor nanocrystals including zinc, selenium, and sulfur.

The first layer may be formed of a multilayer in which the semiconductor nanocrystals of about 6 monolayers (ML) or more, for example, about 7 ML or more, about 8 ML or more, about 9 ML or more, about 10 ML or more, about 11 ML or more, about 12 ML or more, about 13 ML or more, about 14 ML or more, or about 15 ML or more are stacked on the core.

The multilayers may all have the same composition or include different compositions.

For example, the multilayers may include a gradient alloy having a composition that changes, e.g., varies, in a radial direction of the quantum dots. For example, in the multilayers, a content of selenium may have a concentration gradient that decreases from the core of the quantum dot toward the outermost layer, but a content of sulfur may have a concentration gradient that increases from the core of the quantum dot toward the outermost layer.

A mole ratio of zinc to tellurium in the quantum dot according to an embodiment, e.g., as measured by inductively coupled plasma atomic emission spectroscopy (ICP-AES), may be in a range of about 1:0.01 to about 1:0.1, for example, about 1:0.012 to about 1:0.1, about 1:0.014 to about 1:0.1, about 1:0.016 to about 1:0.1, about 1:0.018 to about 1:0.1, about 1:0.020 to about 1:0.1, about 1:0.022 to about 1:0.1, about 1:0.024 to about 1:0.1, about 1:0.026 to about 1:0.1, about 1:0.028 to about 1:0.1, about 1:0.030 to about 1:0.1, about 1:0.032 to about 1:0.1, about 1:0.034 to about 1:0.1, about 1:0.036 to about 1:0.1, about 1:0.038 to about 1:0.1; about 1:0.040 to about 1:0.1, about 1:0.045 to about 1:0.1, about 1:0.050 to about 1:0.1, about 1:0.055 to about 1:0.1, about 1:0.060 to about 1:0.1, about 1:0.065 to about 1:0.1, about 1:0.070 to about 1:0.1, about 1:0.075 to about 1:0.1, about 1:0.080 to about 1:0.1, about 1:0.085 to about 1:0.1, about 1:0.090 to about 1:0.1, about 1:0.095 to about 1:0.1; or about 1:0.095 to about 1:0.01, about 1:0.090 to about 1:0.01, about 1:0.085 to about 1:0.01, about 1:0.080 to about 1:0.01, about 1:0.075 to about 1:0.01, about 1:0.070 to about 1:0.01, about 1:0.065 to about 1:0.01, about 1:0.060 to about 1:0.01, about 1:0.055 to about 1:0.01, about 1:0.050 to about 1:0.01, about 1:0.045 to about 1:0.01, about 1:0.040 to about 1:0.01, about 1:0.035 to about 1:0.01, about 1:0.035 to about 1:0.015, about 1:0.035 to about 1:0.02, about 1:0.030 to about 1:0.02, or about 1:0.030 to about 1:0.025, but is not limited thereto.

When the mole ratio of zinc to tellurium in the quantum dot according to an embodiment is in the disclosed range, the quantum dot has an emission peak wavelength of greater than or equal to about 600 nm, and exhibits high luminous efficiency.

A mole ratio of zinc to selenium in the quantum dot according to an embodiment, e.g., as measured by inductively coupled plasma atomic emission spectroscopy (ICP-AES), may be in a range of about 1:0.2 to about 1:0.7, for example, about 1:0.25 to about 1:0.7, about 1:0.30 to about 1:0.7, about 1:0.35 to about 1:0.7, about 1:0.40 to about 1:0.7, about 1:0.45 to about 1:0.7, about 1:0.46 to about 1:0.7, about 1:0.47 to about 1:0.7, about 1:0.48 to about 1:0.7, about 1:0.49 to about 1:0.7, about 1:0.50 to about 1:0.7, about 1:0.51 to about 1:0.7, about 1:0.52 to about 1:0.7, about 1:0.53 to about 1:0.7, about 1:0.54 to about 1:0.7, about 1:0.55 to about 1:0.7, about 1:0.60 to about 1:0.7, or about 1:0.65 to about 1:0.7; or about 1:0.65 to about 1:0.2, about 1:0.60 to about 1:0.20, about 1:0.55 to about 1:0.20, about 1:0.50 to about 1:0.25, about 1:0.45 to about 1:0.20, about 1:0.45 to about 1:0.25, about 1:0.45 to about 1:0.30, about 1:0.45 to about 1:0.35, about 1:0.45 to about 1:0.40, about 1:0.40 to about 1:0.20, about 1:0.40 to about 1:0.25, about 1:0.40 to about 1:0.30, or about 1:0.35 to about 1:0.30, but is not limited thereto.

When the mole ratio of zinc to selenium in the quantum dot according to an embodiment is in the disclosed range, the quantum dot has an emission peak wavelength of greater than or equal to about 600 nm, and exhibits high luminous efficiency and low, e.g., narrow, full width at half maximum (FWHM), for example, less than or equal to about 60 nm.

A mole ratio of zinc to sulfur in quantum dots according to an embodiment, e.g., as measured by inductively coupled plasma atomic emission spectroscopy (ICP-AES), may be in a range of about 1:0.1 to about 1:0.6, for example, about 1:0.15 to about 1:0.6, about 1:0.18 to about 1:0.6, about 1:0.2 to about 1:0.6, about 1:0.25 to about 1:0.6, about 1:0.28 to about 1:0.6, about 1:0.3 to about 1:0.6, about 1:0.35 to about 1:0.6, about 1:0.4 to about 1:0.6, about 1:0.45 to about 1:0.6, about 1:0.5 to about 1:0.6, about 1:0.55 to about 1:0.6, about 1:0.59 to about 1:0.1, about 1:0.58 to about 1:0.1, about 1:0.57 to about 1:0.1, about 1:0.55 to about 1:0.1, about 1:0.50 to about 1:0.1, about 1:0.45 to about 1:0.1, about 1:0.40 to about 1:0.1, about 1:0.35 to about 1:0.1, about 1:0.33 to about 1:0.1, about 1:0.30 to about 1:0.1, about 1:0.25 to about 1:0.1, about 1:0.20 to about 1:0.1, or about 1:0.15 to about 1:0.1, but is not limited thereto.

When the mole ratio of zinc to sulfur in the quantum dot according to an embodiment is in the disclosed range, the quantum dot has an emission peak wavelength of greater than or equal to about 600 nm, and exhibits high luminous efficiency and low full width at half maximum (FWHM), for example, less than or equal to about 60 nm.

When the quantum dot according to an embodiment has the mole ratios of zinc to tellurium, zinc to selenium, and zinc to sulfur in the quantum dot, the radius of the core of the quantum dot may be greater than or equal to about 1 nm, for example, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm, and less than or equal to about 5 nm, for example, less than or equal to about 4.5 nm, less than or equal to about 4 nm, less than or equal to about 3.5 nm, or less than or equal to about 3 nm, but is not limited thereto.

When the radius of the core of the quantum dot according to an embodiment is in the disclosed range, the thickness of the shell of the quantum dot may be greater than or equal to about 2 nm, for example, greater than or equal to about 2.2 nm, greater than or equal to about 2.4 nm, greater than or equal to about 2.5 nm, greater than or equal to about 2.6 nm, greater than or equal to about 2.7 nm, greater than or equal to about 2.8 nm, greater than or equal to about 2.9 nm, greater than or equal to about 3.0 nm, greater than or equal to about 3.1 nm, greater than or equal to about 3.2 nm, greater than or equal to about 3.3 nm, greater than or equal to about 3.4 nm, greater than or equal to about 3.5 nm, greater than or equal to about 3.6 nm, greater than or equal to about 3.7 nm, greater than or equal to about 3.8 nm, greater than or equal to about 3.9 nm, greater than or equal to about 4.0 nm, greater than or equal to about 4.1 nm, greater than or equal to about 4.2 nm, greater than or equal to about 4.3 nm, greater than or equal to about 4.4 nm, greater than or equal to about 4.5 nm, greater than or equal to about 4.6 nm, greater than or equal to about 4.7 nm, greater than or equal to about 4.8 nm, greater than or equal to about 4.9 nm, or greater than or equal to about 5.0 nm, but is not limited thereto.

When the quantum dot according to an embodiment has the core radius and the shell thickness in the disclosed ranges, the average particle size of the quantum dot may be greater than or equal to about 6 nm, for example, greater than or equal to about 6.5 nm, greater than or equal to about 7.0 nm, greater than or equal to about 7.5 nm, greater than or equal to about 8.0 nm, greater than or equal to about 8.5 nm, greater than or equal to about 9.0 nm, greater than or equal to about 9.5 nm, greater than or equal to about 10.0 nm, greater than or equal to about 10.5 nm, greater than or equal to about 11.0 nm, greater than or equal to about 11.5 nm, or greater than or equal to about 12.0 nm, but is not limited thereto.

Herein, the size of the quantum dot may mean a diameter, or a diameter calculated by assuming a sphere from a two-dimensional electron microscope image when the quantum dot is not spherical.

The quantum dot may have any suitable shape. For example, the quantum dot may include, but is not limited to, a sphere, a polyhedron, a multipod, or a combination thereof. The quantum dot may be in an isotropic form.

The quantum dot according to an embodiment has the core radius, the shell thickness, and the average particle size in the disclosed ranges, the quantum dot emits red light with an emission peak wavelength of greater than or equal to about 600 nm, has high luminous efficiency of greater than or equal to about 50%, and a full width at half maximum of less than or equal to about 60 nm, and exhibits high color purity. Accordingly, the quantum dot according to an embodiment may be usefully used in the display field.

The quantum dot may include an organic ligand on its surface. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH (wherein, R and R' independently include a C1 to C40, for example, a C3 to C30 or C6 to C24 substituted or unsubstituted aliphatic hydrocarbon, or a C6 to C40 substituted or unsubstituted aromatic hydrocarbon, or a combination thereof), or a combination thereof. The organic ligand may be used alone or in a mixture of two or more different compounds.

Examples of the organic ligand compound may be methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, or dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, or stearic acid; a phosphine such as methyl phosphine, ethyl phosphine, propyl phosphine, butyl phosphine, pentyl phosphine, tributyl phosphine, and trioctyl phosphine; a phosphine compound or an oxide compound thereof such as methyl phosphine oxide, ethyl phosphine oxide, propyl phosphine oxide, butyl phosphine oxide, or trioctyl phosphine oxide; diphenyl phosphine, a triphenyl phosphine compound or an oxide compound thereof; phosphonic acid, and the like, but are not limited thereto. The organic ligand compound may be used alone or in a mixture of two or more different compounds.

In an embodiment, the organic ligand compound may be a combination of RCOOH and an amine (e.g., $RNH_2$, $R_2NH$, $R_3N$, or a combination thereof). The organic ligand may not include glutathione. The quantum dot may be water insoluble. The organic solvent is as described herein.

The quantum dot according to an embodiment may be produced using various methods of producing quantum dots, and such a producing method is not limited to a specific method. For example, the quantum dot may be produced through a wet method that includes reacting precursor compounds of semiconductor nanocrystals forming core and shell of a quantum dot in an organic solvent to produce colloidal quantum dots. Such a wet method of producing the quantum dot according to an embodiment may include: preparing a core including a first semiconductor nanocrystal including zinc, and tellurium; and reacting a zinc precursor and a selenium precursor at a shell formation temperature in an organic solvent, in the presence of the core and the organic ligand, so that a semiconductor nanocrystal shell including zinc and selenium is formed on the surface of the core. The forming of the semiconductor nanocrystal shell may further include reacting the zinc precursor with a sulfur precursor, after reacting the zinc precursor with the selenium precursor.

In the preparing of the core, a commercially available core including a first semiconductor nanocrystal including zinc and tellurium may be purchased, or directly manufactured according to a method of preparing the core. For example, the core may be obtained by preparing a zinc precursor solution including a zinc precursor and an organic ligand; preparing a tellurium precursor; heating the zinc precursor solution to a core formation reaction temperature, and adding the tellurium precursor thereto, optionally together with an organic ligand, to proceed with the reaction. Herein, a mole ratio of zinc to tellurium in the core may be appropriately selected so that a mole ratio of total zinc to tellurium in the quantum dot according to an embodiment may be in the range of about 1:0.01 to about 1:0.1, taking into consideration the amount of zinc included in the shell of the quantum dot. For example, the mole ratio of zinc to tellurium in the core may be in a range of about 1:0.5 to about 1:1.

In the forming of the semiconductor nanocrystal shell on the core produced as described herein, the reaction may be performed by adjusting the amounts of the precursors of zinc, selenium, and sulfur for forming the semiconductor nanocrystal shell so that a ratio of mole numbers of selenium and sulfur relative to a mole number of total zinc in the quantum dot according to an embodiment may be about 1:0.2 to about 1:0.7, and about 1:0.1 to about 1:0.6.

The zinc precursor may include a Zn metal powder, ZnO, an alkylated Zn compound (e.g., C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., a zinc chloride), a Zn cyanide, a Zn hydroxide, or a combination thereof. Examples of the zinc precursor may be dimethylzinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The tellurium precursor may include tellurium-trioctyl phosphine (Te-TOP), tellurium-tributyl phosphine (Te-TBP), tellurium-triphenyl phosphine (Te-TPP), or a combination thereof, but is not limited thereto.

The selenium precursor may include selenium-trioctyl phosphine (Se-TOP), selenium-tributyl phosphine (Se-TBP), selenium-triphenyl phosphine (Se-TPP), selenium-diphenyl phosphine (Se-DPP), or a combination thereof, but is not limited thereto.

The sulfur precursor may include hexane thiol, octane thiol, decane thiol, dodecane thiol, hexadecane thiol, mercapto propyl silane, sulfur-trioctyl phosphine (S-TOP), sulfur-tributyl phosphine (S-TBP), sulfur-triphenyl phosphine (S-TPP), sulfur-trioctyl amine (S-TOA), sulfur-octadecene (S-ODE), bistrimethylsilyl sulfur, ammonium sulfide, sodium sulfide, or a combination thereof, and is not limited thereto.

The organic solvent may include a C6 to C22 primary amine such as hexadecyl amine, a C6 to C22 secondary amine such as a dioctyl amine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl amine) substituted with a, e.g., at least one (e.g., 1, 2, or 3), C6 to C22 alkyl group, a phosphine oxide (e.g., trioctyl phosphine oxide) such as (e.g., 1, 2, or 3) substituted with a C6 to C22 alkyl group, a C12 to C22 aromatic ether such as a phenyl ether, a benzyl ether, or a combination thereof.

The organic ligand may coordinate the surface of the produced nanocrystals, and may affect the luminescence and electrical properties of the quantum dot, as well as may well disperse the nanocrystals in the solution phase. Details of the organic ligand are the same as described herein.

A reaction temperature for forming the core of the quantum dot may be greater than or equal to about 200° C., for example, greater than or equal to about 220° C., greater than or equal to about 240° C., greater than or equal to about 260° C., greater than or equal to about 280° C., greater than or equal to about 300° C., greater than or equal to about 320° C., or greater than or equal to about 330° C., and less than or equal to about 340° C., for example, less than or equal to about 330° C. The reaction time for forming the core is not particularly limited and may be appropriately selected.

The reaction conditions, such as reaction temperature and time for forming the shell of the quantum dot, may be appropriately selected taking into consideration a desired shell composition. In an embodiment, the solvent, and optionally, the organic ligand are heated (or put under vacuum) at a predetermined temperature (e.g., at greater than or equal to about 100° C.) under vacuum and heated again at a predetermined temperature (e.g., greater than or equal to 100° C.) and changing into an inert gas atmosphere. Subsequently, the core is added, and the shell precursors may be sequentially or simultaneously added and reacted by heating at a predetermined reaction temperature. The shell precursors may be sequentially added for a reaction time as a mixture having a different ratio to form a shell of a desired composition (e.g., having a gradient or multiple layers). In an embodiment, a zinc precursor and a selenium precursor are reacted to form a first layer of the shell, and then, a zinc precursor and a sulfur precursor are reacted to form a second layer of the shell. A reaction temperature for forming the shell may be greater than or equal to about 280° C., for example, greater than or equal to about 290° C., greater than or equal to about 300° C., greater than or equal to about 310° C., greater than or equal to about 320° C., greater than or equal to about 330° C., greater than or equal to about 340° C., or greater than or equal to about 350° C., and less than or equal to about 360° C., less than or equal to about 350° C., less than or equal to about 340° C., less than or equal to about 330° C., less than or equal to about 320° C., less than or equal to about 310° C., or less than or equal to about 300° C.

An amount and a concentration of each precursor in the reaction system may be selected taking into consideration a desired core and shell composition and reactivity between the precursors. For example, taking into consideration the desired composition (Zn, Te, Se, S, etc.) of the final quantum dot, a ratio between each precursor may be adjusted. A composition of the final quantum dot may be confirmed by appropriate analysis means such as inductively coupled plasma atomic emission spectroscopy.

After completion of the reaction, when a nonsolvent is added to the reaction product, nanocrystal particles coordinated with the ligand compound may be separated. The nonsolvent is miscible with the solvent used in the core formation, shell formation reaction, or a combination thereof, but may be a polar solvent that is not capable of dispersing produced nanocrystals. The nonsolvent may be selected depending the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The separation may be performed by centrifugation, precipitation, chromatography, or distillation. Separated nanocrystals may be added to and washed by a washing solvent as desired. The washing solvent has no particular limit and may have a similar solubility parameter to that of the ligand, and may, for example, include hexane, heptane, octane, chloroform, toluene, benzene, and the like.

A quantum dot-polymer composite according to an embodiment includes a polymer matrix and quantum dots according to an embodiment dispersed in the polymer matrix.

The polymer matrix may include a binder polymer, a polymerization product of a (photo) polymerizable monomer including 1 or more, for example, 2 or more, 3 or more, 4 or more, or 5 or more carbon-carbon unsaturated bonds, and optionally a polymerization product between the (photo) polymerizable monomer and a multi-thiol compound having at least two thiol groups at the terminal end. In an embodiment, the polymer matrix may include a crosslinked polymer, and optionally, a carboxy group-containing binder polymer. The crosslinked polymer may include a thiolene resin, a crosslinked poly(meth)acrylate, or a combination thereof. In an embodiment, the crosslinked polymer may be a polymerization product of the (photo) polymerizable monomer, and optionally, a multi-thiol compound.

The binder polymer may include a carboxylic acid group. The binder polymer may be a copolymer of a monomer mixture including a first monomer including a carboxylic acid group and a carbon-carbon double bond, a second monomer having a carbon-carbon double bond and a hydrophobic moiety and not having a carboxylic acid group, and optionally a third monomer having a carbon-carbon double bond and a hydrophilic moiety and not having a carboxylic acid group; a multiple aromatic ring-containing polymer including a carboxylic acid group (—COOH) and having a backbone structure wherein two aromatic rings are bound to a quaternary carbon atom being a constituent atom of another cyclic moiety in the main chain; or a combination thereof.

The (photo) polymerizable monomer including 1 or more, for example, 2 or more, 3 or more, 4 or more, or 5 or more carbon-carbon unsaturated bonds, and the monomer may include (meth)acryl-based, i.e., (meth)acryl-containing, monomer. Examples of the (meth)acryl-based monomer may include a C1-C10 alkyl(meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth)acrylate, bisphenol A epoxy (meth)acrylate, trimethylolpropane tri(meth)acrylate, ethylene glycol monomethyl ether (meth)acrylate, novolac epoxy (meth)acrylate, diethylene glycol di(meth)acrylate, triethylene glycol di(meth)acrylate, propylene glycol di(meth)acrylate, tris(meth)acryloyloxy ethyl phosphate, or a combination thereof.

The multi-thiol compound may include a compound represented by Chemical Formula 1:

[Chemical Formula 1]

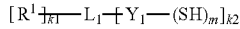

In Chemical Formula 1, $R^1$ is hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroaryl alkyl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group, and both are not hydrogen at the same time); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O)OR' (wherein R' is hydrogen or a C1 to C20 linear or branched alkyl group); —CN, —C(=O)NRR', or —C(=O)ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, or a substituted or unsubstituted C3 to C30 heteroarylene group, wherein methylene (—$CH_2$—) of the substituted C1 to C30 alkylene group may be replaced by sulfonyl (—$SO_2$—), carbonyl (CO), ether (—O—), sulfide (—S—), sulfoxide (—SO—), ester (—C(=O)O—), amide (—C(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein a, e.g., at least one, methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that when $Y_1$ is not a single bond, m does not exceed the valence of $Y_1$, and provided that a sum of k1 and k2 does not exceed the valence of $L_1$.

The multi-thiol compound may include a compound represented by Chemical Formula 2:

[Chemical Formula 2]

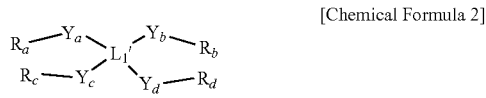

In Chemical Formula 2, $L_1'$ is carbon, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; a substituted or unsubstituted C3 to C30 heterocycloalkylene group, $Y_a$ to $Y_d$ are independently a direct bond; a substituted or unsubstituted C1 to C30 alkylene group; a substituted or unsubstituted C2 to C30 alkenylene group; or a C1 to C30 alkylene group or a C2 to C30 alkenylene group wherein a, e.g., at least one, methylene (—$CH_2$—) is replaced by wherein a, e.g., at least one, methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_a$ to $R_d$ are, each independently, $R^1$ or SH of Chemical Formula 1, provided that at least two of $R_a$ to $R_d$ are SH.

The thiol compound may be a dithiol compound, a trithiol compound, a tetrathiol compound, or a combination thereof. For example, the thiol compound may be glycoldi-3-mercaptopropionate, glycol dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

As described herein, the quantum dot according to an embodiment may emit red light with high quantum efficiency. Accordingly, the quantum dot-polymer composite may have high quantum efficiency and may emit red light. Accordingly, the quantum dot-polymer composite may be applied as a photoluminescent element of a display device according to an embodiment.

Accordingly, a display device according to an embodiment includes a light source and a photoluminescent element, the photoluminescent element includes a quantum dot-polymer composite according to an embodiment, and the light source is configured to provide incident light to the photoluminescent element.

The incident light may have an emission peak wavelength in a range of greater than or equal to about 440 nm, for example, greater than or equal to about 450 nm and less than or equal to about 460 nm. In an embodiment, the photoluminescent element may include a sheet or pattern of the quantum dot-polymer composite.

The display device may further include a liquid crystal panel, and the sheet (quantum dot (QD) sheet) or pattern (QD pattern) of the quantum dot-polymer composite may be disposed between the light source and the liquid crystal panel.

FIG. 1 shows an exploded view of a non-limiting display device. Referring to FIG. 1, the display device may have a structure wherein a reflector, a light guide (plate) (LGP) and a blue light emitting diode (LED) light source (Blue-LED), the aforementioned quantum dot-polymer composite sheet (QD sheet), and for example, various optical films of a prism, and a double brightness enhance film (DBEF)), and the like are stacked, and a liquid crystal (LC) panel is disposed thereon.

In an embodiment, the display device may include a stacked structure including a (e.g., transparent) substrate and a light emitting layer, for example, a photoluminescent layer disposed on the substrate as a light emitting element. In the stacked structure, the light emitting layer includes a pattern of the quantum dot-polymer composite and the pattern may include a, e.g., at least one, repeating section to emit light at a predetermined wavelength. The pattern of the quantum dot-polymer composite may include a, e.g., at least one, repeating section such as a first section configured to emit a first light, a second section configured to emit a second light, or a combination thereof.

The first light and the second light may have different emission peak wavelengths in an emission spectrum. In an embodiment, the first light may be red light having a maximum emission peak wavelength of about 600 nm to about 650 nm (e.g., about 620 nm to about 650 nm), and the second light may be green light having a maximum emission peak wavelength of about 500 nm to about 550 nm (e.g., about 510 nm to about 550 nm).

The substrate may be a substrate including an insulation material. The substrate may include glass; various polymers such as polyesters such as polyethylene terephthalate (PET), polyethylene naphthalate (PEN), and the like, polycarbonate, polyacrylate, and the like; polysiloxane (e.g., polydimethylsiloxane (PDMS)); inorganic materials such as $Al_2O_3$, ZnO, and the like; or a combination thereof, but is not limited thereto. A thickness of the substrate may be appropriately selected taking into consideration the substrate material and the like, and is not particularly limited. The substrate may be flexible. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to block (e.g., absorb or reflect) blue light. A layer capable of blocking blue light (blue light blocking layer) may be disposed at or on at least a portion of the surfaces of the substrate. For example, the blue light blocking layer may include an organic material (e.g., polymer) and a predetermined dye (a yellow dye or a dye that transmits green/red light and absorbs blue light), but is not limited thereto.

In the aforementioned display device, the light source may include a plurality of light emitting units corresponding to the first section and the second section respectively and the light emitting unit may include a first electrode and a second electrode facing each other and an electroluminescent layer disposed between the first electrode and the second electrode.

The electroluminescent layer may include an organic light emitting material. For example, each light emitting unit of the light source may include an electroluminescent device (e.g., an organic light emitting diode) configured to emit light of a predetermined wavelength (e.g., blue light, green light, or a combination thereof). The structures and materials of the electroluminescent device and the organic light emitting diode are not particularly limited.

Figure 2B:
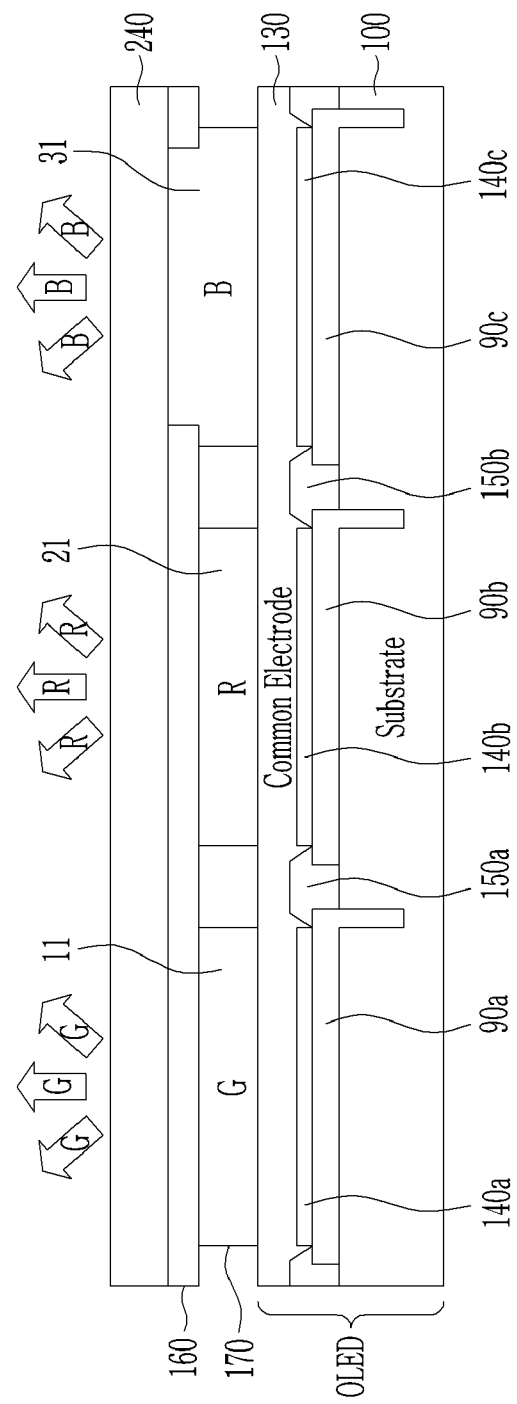
FIG. 2B is a schematic cross-sectional view of a display device according to an embodiment.

Specific examples of the display device are shown in FIGS. 2A and 2B.

Referring to FIGS. 2A and 2B, the light source includes an organic light emitting diode (e.g., emitting blue light or light having a wavelength of less than or equal to about 500 nm). The organic light emitting diode (OLED) may include at least two pixel electrodes 90a, 90b, and 90c on a substrate 100, pixel define layers 150a, and 150b, formed between neighboring pixel electrodes 90a, 90b, and 90c, organic emission layers 140a, 140b, and 140c on each pixel electrode, and a common electrode 130 layer formed on the organic emission layers.

The substrate 100 may include an insulating material and may have flexibility. Details of the substrate are the same as described herein.

A line layer including a thin film transistor or the like is formed on the substrate. The line layer may further include a gate line, a sustain voltage line, a gate insulating layer, a data line, a source electrode, a drain electrode, a semiconductor, a protective layer, and the like. The detail structure of the line layer may be verified according to an embodiment. The gate line and the sustain voltage line are electrically separated from each other, and the data line is insulated and crosses the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrodes 90a, 90b, and 90c may function as an anode of the display device. The pixel electrode may include a transparent conductive material such as indium tin oxide (ITO) or indium zinc oxide (IZO). The pixel electrode may include a material having a light-blocking properties such as gold (Au), platinum (Pt), nickel (Ni), tungsten (W), chromium (Cr), molybdenum (Mo), iron (Fe), cobalt Co), copper (Cu), palladium (Pd), titanium (Ti), and the like. The pixel electrode may have a two-layered structure in which the transparent conductive material and the material having light-blocking properties are stacked sequentially. Between two adjacent pixel electrodes, a pixel define layer (PDL) 150a or 150b overlaps with a terminal end of the pixel electrode to divide the pixel electrode into a pixel unit.

The pixel define layer is an insulating layer which may electrically block the at least two pixel electrodes. The pixel define layer covers a part of the upper surface of the pixel electrode, and the remaining region of the pixel electrode that is not covered by the pixel define layer may provide an opening. An organic emission layer 140a, 140b, and 140c which will be described herein may be formed on or in the region defined by the opening. The organic emission layer 140a, 140b, and 140c defines each pixel area by the pixel electrode and the pixel define layer. In other words, one pixel area may be defined as an area including one organic emission unit layer which is contacted with one pixel electrode divided by the pixel define layer. For example, in the display device according to an embodiment, the organic emission layer may be defined as a first pixel area, a second pixel area, and a third pixel area, and each pixel area is spaced apart from each other leaving a predetermined interval by the pixel define layer.

The organic emission layer may emit a third light belonging to visible light region or belonging to an ultraviolet (UV) region. That is, each of the first to the third pixel areas of the organic emission layer may emit a third light. In an embodiment, the third light may be a light having the highest energy in the visible light region, for example, blue light. When all pixel areas of the organic emission layer are designed to emit the same light, each pixel area of the organic emission layer may include the same or similar materials or may have the same or similar properties. A process of forming the organic emission layer may be simplified, and the organic emission layer may be formed by large scale/large area applications, e.g., processes. However, the organic emission layer according to an embodiment is not limited thereto, but the organic emission layer may be designed to emit at least two different lights. The organic light emitting layer includes an organic emission unit layer in each pixel area, and each organic emission unit layer may further include an auxiliary layer (e.g., hole injection layer, hole transport layer, electron transport layer, etc.) in addition to the light emitting layer. The common electrode 130 may function as a cathode of the display device. The common electrode may include a transparent conductive material such as indium tin oxide (ITO) or indium zinc oxide (IZO). The common electrode may be formed on the organic emission layer 140*a*, 140*b*, and 140*c* and may be integrated therewith.

A planarization layer or a passivation layer (not shown) may be formed on the common electrode. The planarization layer may include a (e.g., transparent) insulating material for ensuring electrical insulation with the common electrode. A stack structure is disposed on the light source and includes a quantum dot polymer composite pattern 170 (e.g., a first section 11 including a red quantum dot and a second section 21 including a green quantum dot) and a substrate 240. The blue light emitted from a light source enters the first section 11 and the second section 21 to emit red and green light, respectively. The blue light emitted from a light source may transmit the third section 31.

This device may be manufactured by separately manufacturing the disclosed stack structure and (e.g., blue light-emitting) OLED and then assembling them. The device may be manufactured by directly forming a quantum dot polymer composite pattern 170 on the OLED.

In the device according to an embodiment, an optical element blocking (e.g., reflecting or absorbing) blue light 160 may be disposed on the first section 11 emitting red light and the second section 21 emitting green light. The optical element blocking blue light 160 may include a blue light reflection layer, a blue light absorption layer, or a combination thereof. The optical element blocking blue light 160 may include a blue cut filter, a polymer layer including a yellow dye, or a combination thereof, and the optical element blocking blue light 160 may be disposed on a substrate 240. The optical element blocking blue light 160 may be disposed on the first section 11 and the second section 21 between the substrate 240 and the quantum dot-polymer composite pattern 170. A detailed description of the optical element blocking blue light 160 is the same as that of a first optical filter 310 which will be described herein.

In an embodiment, the display device may further include a lower substrate, a polarizing plate disposed under the lower substrate, and a liquid crystal layer disposed between the stacked structure and the lower substrate, and in the stacked structure, the photoluminescent layer may be disposed to face the liquid crystal layer. The display device may further include a polarizing plate between the liquid crystal layer and the photoluminescent layer. The light source may further include LED and if desired, a light guide panel. Non-limiting examples of the display device (e.g., a liquid crystal display device) according to an embodiment are illustrated with reference to a drawing.

Figure 3:
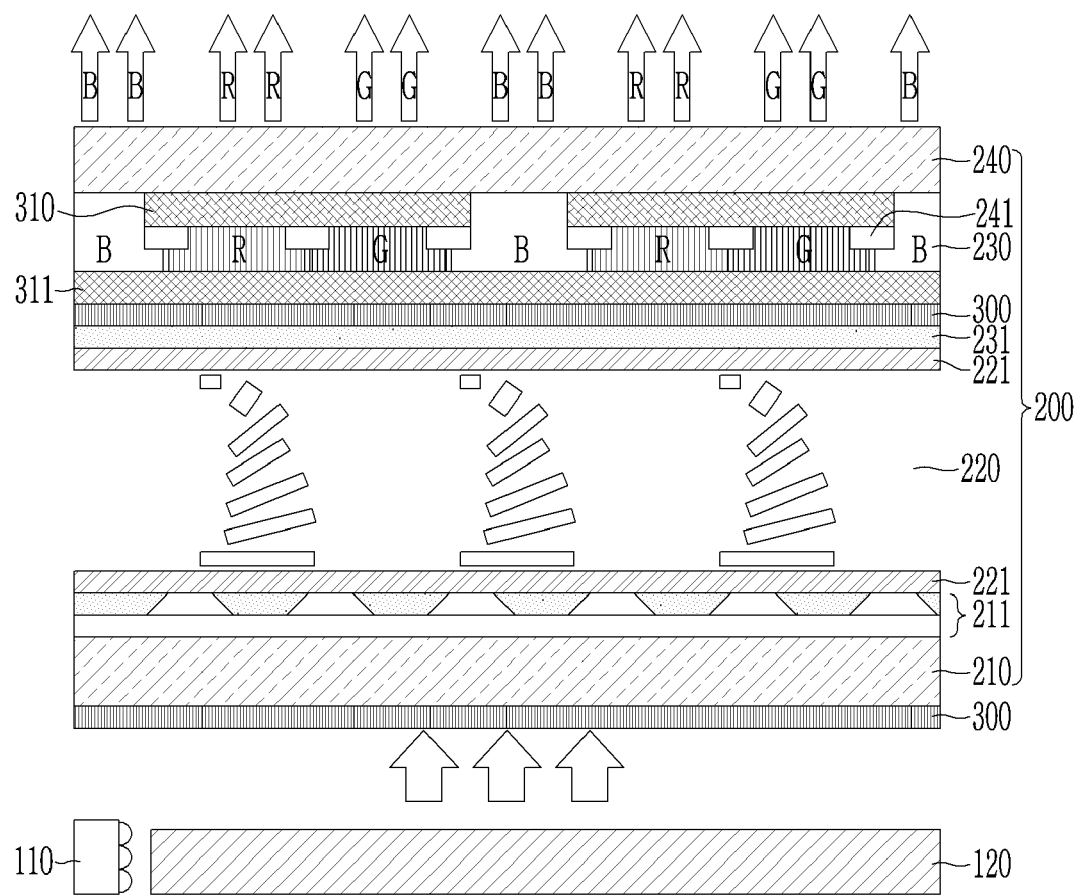
FIG. 3 is a schematic cross-sectional view of a display device according to an embodiment.

A specific example of such a display device is shown in FIG. 3.

Referring to FIG. 3, in an embodiment, a display device includes a liquid crystal panel 200, an optical element 300 (e.g., polarizing plate) disposed on the liquid crystal panel 200, under the liquid crystal panel 200, or a combination thereof, and a backlight unit including a blue light emitting light source disposed under the optical element 300. The backlight unit may include a light source 110 and a light guide plate 120 (edge type). The backlight unit may be a direct type without a light guide plate (not shown). The liquid crystal panel 200 includes a lower substrate 210, an upper substrate 240, and a liquid crystal layer 220 between the upper and lower substrates, and may include a color filter layer 230 disposed on the upper or lower surface of the upper substrate 240. The color filter layer 230 may include the aforementioned quantum dot-polymer composite, or a pattern thereof.

The wiring board 211 may be provided on the inner surface, for example, the upper surface of the lower substrate 210. The wiring board 211 includes a plurality of gate wires (not shown) and data wires (not shown) defining a pixel area, a thin film transistor provided adjacent to the intersection of the gate wires and the data wires, and a pixel electrode for each pixel area, but is not limited thereto. Specific details of such a wiring board are not particularly limited.

A liquid crystal layer 220 is provided on the wiring board 211. The liquid crystal layer 220 may include each alignment layer 221 on and under the layer for initial alignment of liquid crystal materials included therein. Specific details of the liquid crystal material and the alignment layer (e.g., a liquid crystal material, an alignment layer material, a method of forming a liquid crystal layer, a thickness of the liquid crystal layer, etc.) are not particularly limited.

In an embodiment, an upper optical element or a polarizing plate 300 may be provided between the liquid crystal layer 220 and the upper substrate 240, but is not limited thereto. For example, the upper polarizing plate may be disposed between the liquid crystal layer 220 or the common electrode 231 and the photoluminescent layer, e.g., color filter layer, 230 (or a quantum dot-polymer composite pattern). In an embodiment, the optical device 300 may be a polarizer. A black matrix 241 including openings and covering a gate line, a data line, a thin film transistor, etc. of a wiring board provided on the lower substrate is provided on the upper substrate 240, for example, the bottom surface thereof. A second color filter (R) that emits red light, a first color filter (G) that emits green light, a third color filter (B) for emitting or transmitting blue light, or a combination thereof may be disposed in the openings of the black matrix 241 on the black matrix 241. For example, the black matrix 241 may have a lattice shape. If desired, the photoluminescent layer may further include one or more fourth sections. The fourth section may be configured to emit light of a different color than the light emitted from the first to third sections, such as cyan, magenta, and yellow.

The color filter layer 230 may be disposed on the transparent common electrode 231.

If desired, the display device may further include a blue light blocking layer (hereinafter, also referred to as a first optical filter layer 310 and a second optical filter layer 311). The blue light blocking layer may be disposed between the bottom surface of the second section (R) and the first section (G) and the upper substrate 240 or on the upper surface of the upper substrate 240. The blue light blocking layer may include a sheet having openings that correspond to a pixel area showing a blue color (e.g., third section (B)) and may be formed on portions corresponding to the first (G) and second (R) sections. The first optical filter layer 310 may be integrally formed as an integrated structure at the remaining positions except positions overlapped with the third section (B), but is not limited thereto. At least two first optical filter layers may be spaced apart and be disposed at each of the positions overlapped with the first (G) and second (R) sections.

For example, the first optical filter layer 310 may block light having a portion of a wavelength region in the visible light region and transmit light having other wavelength regions. For example, the first optical filter layer 310 may block blue light and transmit light except blue light. For example, the first optical filter layer 310 may transmit green light, red light, and/or or yellow light that is mixed light thereof.

The first optical filter layer 310 may include a polymer thin film including a dye, a pigment, or a combination thereof that absorbs light having a wavelength to be blocked. The first optical filter layer 310 may block at least 80%, or at least 90%, even at least 95% of blue light having a wavelength of less than about 480 nm, and may have light transmittance of greater than or equal to about 70%, greater than or equal to about 80%, greater than or equal to about 90%, or even about 100% with respect to other visible light of greater than about 500 nm and less than or equal to about 700 nm.

The first optical filter layer 310 may absorb blue light of less than or equal to about 500 nm and substantially block it, but may for example selectively transmit green light or red light. In this case, at least two first optical filter layers may be spaced apart and disposed at each of the positions overlapped with the first to second sections, respectively. For example, a first optical filter layer selectively transmitting red light may be disposed at the position overlapped with the section emitting red light and the first optical filter layer selectively transmitting green light may be disposed at the position overlapped with the section emitting green light, respectively.

For example, the first optical filter layer 310 may include a first region, a second region, or a combination thereof, wherein the first region blocks, for example, absorb blue light and red light and transmits light having a wavelength of a predetermined range, for example, greater than or equal to about 500 nm, greater than or equal to about 510 nm, or greater than or equal to about 515 nm and less than or equal to about 550 nm, less than or equal to about 540 nm, less than or equal to about 535 nm, less than or equal to about 530 nm, less than or equal to about 525 nm, or less than or equal to about 520 nm and the second region blocks, for example, absorb blue light and green light and transmits light having a wavelength of predetermined ranges, for example, greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region may be disposed at the position overlapped with the section emitting green light and the second region may be disposed at the position overlapped with the section emitting red light. The first region and the second region may be optically isolated by for example, black matrixes and the like. The first optical filter layer 310 may contribute to improving color purity of a display device.

The first optical filter layer 310 may be a reflective filter including a plurality of layers (e.g., inorganic material layers) with different refractive index. For example, two layers having different refractive index may be alternately stacked with each other, or for example a layer having a high refractive index and a layer having a low refractive index may be alternately stacked with each other.

The display device may further include a second optical filter layer 311, for example, red/green or yellow light recycling layer disposed between the photoluminescent layer and the liquid crystal layer, for example, between photoluminescent layer and upper polarizer) and transmitting at least a portion of the third light and reflecting at least a portion of the first light and the second light. The second optical filter layer 311 may reflect light in a wavelength region of greater than about 500 nm. The first light may be green or red light, the second light may be red or green, and the third light may be blue light.

Figure 4:
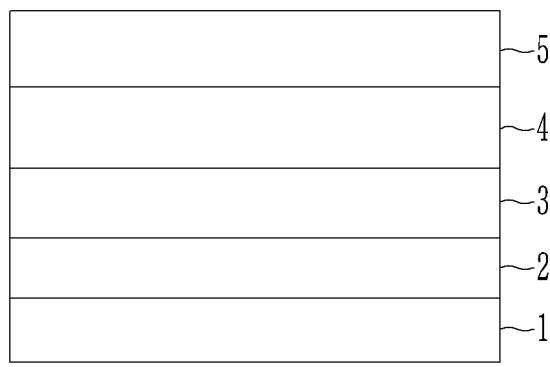
FIG. 4 is a schematic cross-sectional view of an electroluminescent device according to an embodiment.

The quantum dots according to an embodiment may be used as a light emitting layer in an electroluminescent device including quantum dots (see FIG. 4). The luminescent device includes an anode 1 and a cathode 5 facing each other; a quantum dot light emitting layer 3 between the anode and the cathode and including a plurality of quantum dots; and a hole auxiliary layer 2 between the anode and the quantum dot light emitting layer. The hole auxiliary layer may further include a hole injecting layer (HIL), a hole transporting layer (HTL), an electron blocking layer (EBL), or a combination thereof. The hole auxiliary layer may include any suitable organic/inorganic material having hole properties. The quantum dot light emitting device may further include an electron auxiliary layer 4 between the cathode and the quantum dot light emitting layer. The electron auxiliary layer may further include an electron injecting layer (EIL), an electron transporting layer (ETL), a hole blocking layer (HBL), or a combination thereof. The electron auxiliary layer may include any suitable organic/inorganic material having electronic properties.

Hereinafter, the embodiments are illustrated in more detail with reference to examples. However, they are exemplary embodiments of the present invention, and the present invention is not limited thereto.

EXAMPLES

Analysis Methods
1. Photoluminescence Spectroscopy Analysis
Using a Hitachi F-7000 spectrometer, a photoluminescence (PL) spectrum of produced nanocrystals at an irradiation wavelength of 450 nanometers (nm) is obtained.
2. Inductively Coupled Plasma (ICP) Analysis
Using Shimadzu ICPS-8100, an inductively coupled plasma atom light emitting spectroscopy (ICP-AES) analysis is performed.
3. Transmission Electron Microscope (TEM) Analysis
Using a UT F30 Tecnai electron microscope, a transmission electron microscope image of a quantum dot is obtained.

Syntheses are carried out in an inert gas atmosphere (under nitrogen flowing conditions) unless otherwise specified.

Reference Example 1: Production of ZnTe Core Having Diameter of about 2.75 nm

A Se/trioctyl phosphine (TOP) stock solution, a S/TOP stock solution, and a Te/TOP stock solution having a concentration of about 0.1 moles per liter (molar (M)) to 0.4 M are obtained by dispersing selenium, sulfur, and tellurium, respectively, in trioctyl phosphine (TOP). A mixed solution containing the Te/TOP stock solution, an organic ligand including diphenylphosphine and oleylamine, and lithium aluminum hydride is prepared.

In a 300 milliliter (mL) reaction flask, 0.9 millimoles (mmol) of zinc acetate is dissolved in 1-octadecene with oleic acid and heated to 120° C. under vacuum. After 1 hour, the atmosphere in the reactor is converted to an inert gas and heated to 300° C. Subsequently, the mixed solution including the Te/TOP stock solution is rapidly injected thereto and reacted to provide a core. Then, the reaction solution is promptly cooled at a room temperature and added with acetone, and centrifuged to provide a precipitate, and the precipitate is dispersed in toluene to provide a ZnTe core. The Te amount relative to 1 mole of Zn is about 0.5 moles.

From the results of analyzing an image using a Transmission Electron Microscope (TEM), it is confirmed that the obtained ZnTe core has a diameter of about 2.75 nm.

Comparative Examples 1 and 2: Production of ZnTe/ZnSe Quantum Dot and ZnTe/ZnSe/ZnS Quantum Dot TOA (trioctyl acetate) is added into a 300 mL reaction flask, zinc acetate and oleic acid are added, and then, the mixture is put under vacuum at 120° C. The inside of the flask is substituted with nitrogen (N$_2$). While the reaction flask is heated to 340° C., the toluene dispersion having a ZnTe core according to Reference Example 1 is rapidly added thereto, and subsequently, a Se/TOP stock solution is added thereto. Then, the mixture is reacted for each different time between about 60 minutes and about 100 minutes, to form each different two types of quantum dots having a ZnTe/ZnSe core/shell structure, respectively including a different thickness of ZnSe layer disposed on the core.

Among the formed ZnTe/ZnSe quantum dots, to one type of quantum dot having the ZnSe layer formed for a longer time, an S/TOP stock solution with zinc oleate is added and further reacted for 30 minutes to additionally form a ZnS layer on the ZnSe layer to obtain a ZnTe/ZnSe/ZnS quantum dot.

The quantum dot having a ZnTe/ZnSe core/shell structure (Comparative Example 1), and the quantum dot having a ZnTe/ZnSe/ZnS core/shell structure, which further has the ZnS layer (Comparative Example 2) are respectively measured with each thickness of the ZnSe shell and the ZnS shell through ICP and TEM analyses, and in addition, photoluminescence properties thereof are analyzed. The results are shown in Table 1.

Example 1 and Example 2: Production of ZnTe/ZnSe/ZnS Quantum Dot

Trioctyl acetate (TOA) is added into a 300 mL reaction flask, zinc acetate and oleic acid are added, and the mixture is put under at 120° C. The inside of the flask is substituted with nitrogen (N$_2$). While the reaction flask is heated to 340° C., the toluene dispersion with a ZnTe core according to Reference Example 1 is rapidly added thereto, and subsequently, a Se/TOP stock solution is added thereto. Then, the mixture is reacted for each different time between about 60 minutes and about 100 minutes, to form two types of a ZnSe layer having each different thickness on the core.

Subsequently, an S/TOP stock solution with zinc acetate is respectively added to the two types of quantum dots having the ZnSe layer having different thicknesses, and then, respectively reacted for about 30 minutes to form a ZnS layer on each ZnSe layer.

Figure 5:
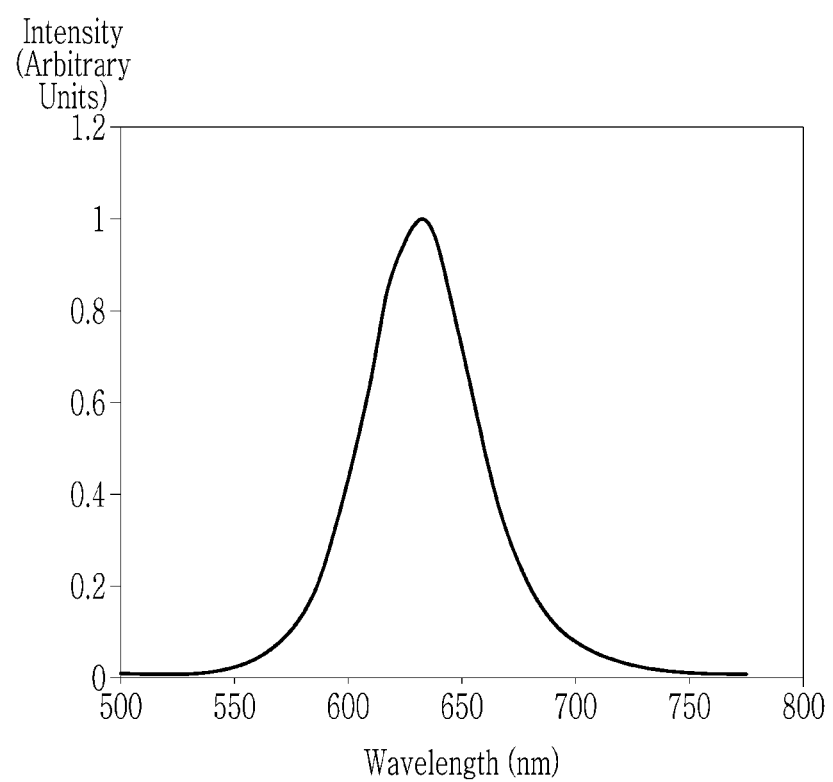
FIG. 5 is a graph of Intensity (arbitrary units) versus Wavelength (nm) showing the emission spectrum of the quantum dot according to Example 1.

The quantum dots having a ZnTe/ZnSe/ZnS core/shell structure according Examples 1 and 2 are measured with respect to each thickness of a ZnSe shell and a ZnS shell through the ICP and TEM analyses, and in addition, photoluminescence properties thereof are analyzed. The results are shown in Table 1. In addition, the quantum dot of Example 1 is ICP analyzed, and the results are shown in Table 2, and FIG. 5 shows a light emitting spectrum of the quantum dot of Example 1.

TABLE 1

|  | ZnSe (thickness) | ZnS (thickness) | Emission peak wavelength (nm) | FWHM (nm) | AQY (%) |
|---|---|---|---|---|---|
| Example 1 | 11 ML | 3 ML | 628 | 56 | 64 |
| Example 2 | 8 ML | 2 ML | 626 | 59 | — |
| Comparative Example 1 | 2 ML | — | 490 | 51 | — |
| Comparative Example 2 | 2 ML | 1 ML | 490 | 47 | — |

ML = monolayer
FWHM = full width at half maximum
AQY = absolute quantum yield

TABLE 2

|  | Mole ratio (x/Zn) | | | |
|---|---|---|---|---|
|  | S | Zn | Se | Te |
| Example 1 | 0.44 | 1.00 | 0.48 | 0.029 |

As shown from Table 1, the quantum dots according to Examples 1 and 2 are cadmium-free red light-emitting quantum dots having a core/shell structure including a ZnSe shell with a thickness of 8 ML or more on a ZnTe core and additionally, a ZnS shell thereon, emitting red light having an emission peak wavelength of greater than 600 nm, and having a low full width at half maximum (FWHM) of less than or equal to 60 nm, and high color purity, and in addition, high luminous efficiency of greater than or equal to 50%. These quantum dots may be used as quantum dots for a display due to high quantum efficiency and a narrow full width at half maximum (FWHM).

On the other hand, the quantum dot of Comparative Example 1 has a ZnSe shell thickness of less than or equal to 3 ML and also includes no ZnS shell, and accordingly, emits light with an emission peak wavelength of less than 500 nm, but no red light.

The quantum dot of Comparative Example 2 further includes ZnS shell. However, the thickness of the ZnSe shell is less than 3 ML, and does not have sufficient size growth. Accordingly, the quantum dot emits light with an emission peak wavelength of less than 500 nm, but no red light.

In this way, the quantum dot according to an embodiment, which has a core/shell structure and includes zinc, tellurium, sulfur, and selenium, wherein the zinc and the tellurium are included in the core, whereas the zinc and the selenium are included in the shell disposed on the core, and in addition, the shell is formed to have a sufficient thickness, and in addition, includes an additional shell including sulfur at the outermost layer, has a core/shell structure over, e.g., greater than, a predetermined size, and may emit red light with high efficiency but still has a reduced full width at half maximum (FWHM). Accordingly, the quantum dot according to an embodiment may advantageously be used in a display and the like.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A quantum dot comprising:
   zinc,
   tellurium,
   selenium, and
   sulfur,
   wherein the quantum dot comprises a core and a shell disposed on the core, and
   wherein the quantum dot is a cadmium-free red light-emitting quantum dot and has an emission peak wavelength of greater than or equal to about 600 nanometers, and efficiency of greater than or equal to about 50%.

2. The quantum dot of claim 1, wherein the core of the quantum dot comprises zinc and tellurium.

3. The quantum dot of claim 1, wherein the shell of the quantum dot comprises zinc and selenium.

4. The quantum dot of claim 3, wherein the shell of the quantum dot further comprises sulfur.

5. The quantum dot of claim 1, wherein the shell of the quantum dot has a composition that varies in a radial direction.

6. The quantum dot of claim 1, wherein the shell of the quantum dot comprises a first layer disposed directly on the core, and a second layer disposed on the first layer, wherein the first layer and the second layer comprise semiconductor nanocrystals having different compositions.

7. The quantum dot of claim 6, wherein the first layer comprises zinc, selenium, and optionally sulfur, and the second layer comprises zinc and sulfur.

8. The quantum dot of claim 7, wherein the second layer is an outermost layer of the quantum dot, and the second layer does not comprise selenium.

9. The quantum dot of claim 1, wherein a mole ratio of zinc to tellurium of the quantum dot is in a range of about 1:0.01 to about 1:0.1.

10. The quantum dot of claim 1, wherein a mole ratio of zinc and selenium of the quantum dot is in a range of about 1:0.2 to about 1:0.7.

11. The quantum dot of claim 1, wherein a mole ratio of zinc to sulfur in the quantum dot is in a range of about 1:0.1 to about 1:0.6.

12. The quantum dot of claim 1, wherein an average particle diameter of the quantum dot is greater than or equal to about 6 nanometers.

13. The quantum dot of claim 1, wherein a thickness of the shell of the quantum dot is greater than or equal to about 2 nanometers.

14. The quantum dot of claim 1, wherein a full width at half maximum of the emission peak wavelength of the quantum dot is less than or equal to about 60 nanometers.

15. A quantum dot-polymer composite, comprising:
   a polymer matrix; and
   a plurality of the quantum dots of claim 1 dispersed in the polymer matrix.

16. The quantum dot-polymer composite of claim 15, wherein the polymer matrix comprises a thiol-ene resin, a (meth)acrylate polymer, a urethane polymer, an epoxy polymer, a vinyl polymer, a silicone polymer, or a combination thereof.

17. A display device, comprising:
   a light source; and
   a luminescent element,
   wherein the luminescent element comprises the quantum dot-polymer composite of claim 15, and
   the light source is configured to provide the luminescent element with incident light.

18. An electroluminescent device, comprising
   a first electrode and a second electrode facing each other; and
   a quantum dot light emitting layer between the first electrode and the second electrode and comprising a plurality of quantum dots,
   wherein the plurality of quantum dots comprise the quantum dot of claim 1.

19. The electroluminescent device of claim 18, wherein the electroluminescent device comprises a charge auxiliary layer between the first electrode and the quantum dot light emitting layer, between the second electrode and the quantum dot light emitting layer, or between the first electrode and the quantum dot light emitting layer and between the second electrode and the quantum dot light emitting layer.

20. The electroluminescent device of claim 19, wherein the charge auxiliary layer comprises a charge transporting layer, a charge injecting layer, or a combination thereof.

* * * * *